US007724106B2

(12) United States Patent
Jünemann et al.

(10) Patent No.: US 7,724,106 B2
(45) Date of Patent: May 25, 2010

(54) COAXIAL CONNECTING PART

(75) Inventors: Ralf Jünemann, München (DE); Rupert Huber, Dorfen (DE); Thomas Reichel, Baldham (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 258 days.

(21) Appl. No.: 11/574,501

(22) PCT Filed: Sep. 14, 2005

(86) PCT No.: PCT/EP2005/009896

§ 371 (c)(1),
(2), (4) Date: Oct. 4, 2007

(87) PCT Pub. No.: WO2006/029847

PCT Pub. Date: Mar. 23, 2006

(65) Prior Publication Data

US 2008/0119062 A1 May 22, 2008

(30) Foreign Application Priority Data

Sep. 16, 2004 (DE) ....................... 10 2004 044 975

(51) Int. Cl.
*H03H 7/38* (2006.01)
*H01P 1/00* (2006.01)
*H01R 12/00* (2006.01)
*H01R 9/05* (2006.01)

(52) U.S. Cl. ........................... 333/33; 333/260; 439/63; 439/581

(58) Field of Classification Search ................... 439/63, 439/578, 581, 891; 333/33, 260, 264
See application file for complete search history.

(56) References Cited

U.S. PATENT DOCUMENTS

| | | | | | |
|---|---|---|---|---|---|
| 2,663,753 | A | * | 12/1953 | Bird | 174/88 C |
| 3,088,089 | A | | 4/1963 | Gregoire | |
| 3,315,184 | A | | 4/1967 | Wood | |
| 4,125,308 | A | * | 11/1978 | Schilling | 439/63 |
| 4,588,241 | A | | 5/1986 | Ardezzone | |
| 4,815,986 | A | | 3/1989 | Dholoo | |
| 5,618,205 | A | * | 4/1997 | Riddle et al. | 439/581 |
| 5,722,856 | A | * | 3/1998 | Fuchs et al. | 439/578 |
| 2004/0029433 | A1 | | 2/2004 | Lee | |

FOREIGN PATENT DOCUMENTS

| | | | |
|---|---|---|---|
| DE | 1591440 | | 4/1970 |
| EP | 0722202 | A2 | 7/1996 |
| JP | 08106960 | A | 4/1996 |

* cited by examiner

*Primary Examiner*—Xuong M Chung-Trans
(74) *Attorney, Agent, or Firm*—Christensen O'Connor Johnson Kindness PLLC

(57) ABSTRACT

The invention relates to a coaxial connecting part which is used to connect a coaxial plug socket to a circuit carrier in an internal conductor. An elastically flexible bellows made of a conductive material is incorporated therein in order to keep axial and radial forces, occurring at the beginning of the socket, away from the substrate.

4 Claims, 1 Drawing Sheet

COAXIAL CONNECTING PART

Figure 1:
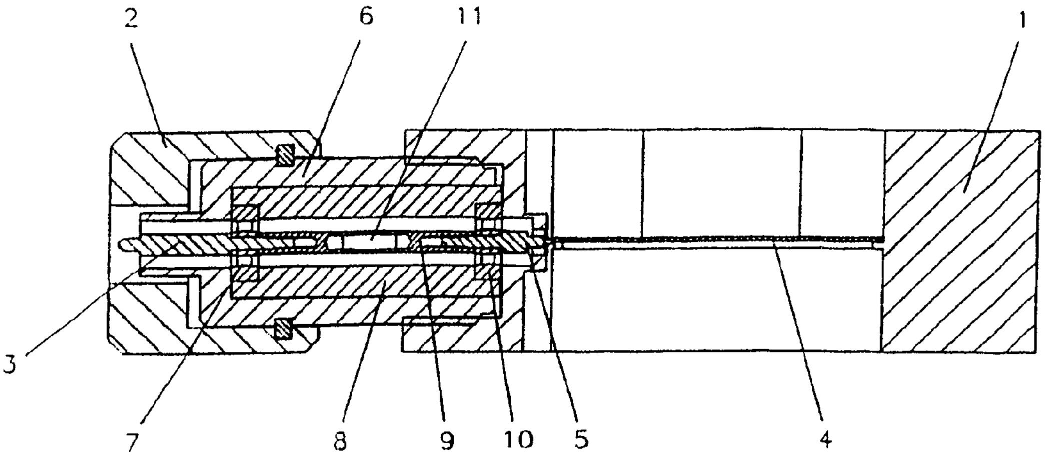

The invention relates to a coaxial connecting element for connecting a coaxial jack to a circuit carrier.

In measuring devices used in high-frequency technology, the coaxial jack used as the measurement port, which is installed in the front panel of the measuring device and is accessible from the outside, is generally connected via a portion of coaxial line to the printed conductor of the actual measuring-device circuit formed on a planar circuit carrier (substrate), and the inner conductor of this portion of coaxial line is attached to the printed conductor of the circuit carrier, for example, by soldering. Forces acting on the outer conductor of the coaxial jack are absorbed in the housing, because the coaxial jack and the housing are connected to one another via a screw connection. By contrast, the connection between the inner conductor and the printed conductor of the substrate is mechanically very sensitive. Even extremely small axial or radial forces in the inner conductor can damage the circuit carrier and/or its printed conductors. Such axial and/or radial forces are generated primarily by the user when screwing and unscrewing the plug of the measurement cable to and from the coaxial jack of the measuring device, because even with very careful processing of the jacks, the inner conductor is moved in an axial and radial manner when screwing and unscrewing the plug, and these small movements of the inner conductor are then sufficient to damage the circuit carrier as mentioned above.

The object of the invention is therefore to provide a coaxial connecting element, which prevents such damage to the circuit carrier by the inner conductor.

This object is solved on the basis of a coaxial connecting element according to the preamble of the independent claim by its characterising features. Advantageous further developments are specified in the dependent claims.

As a result of the bellows interconnected in the inner conductor, any axial and/or radial forces occurring in the inner conductor are absorbed and therefore kept away from the sensitive connecting position between the inner conductor and the printed conductor of the planar circuit carrier. The connecting element according to the invention, which is preferably integrated directly in the coaxial jack with the bellows incorporated in the inner conductor, is therefore particularly suitable for high-frequency electronic measuring devices, wherein measuring cables are frequently screwed and unscrewed to and from the externally-accessible coaxial measurement ports, generally mounted on the front panel, and wherein the inner conductor is therefore exposed to strong axial and radial forces especially in cases of rough handling. In spite of the bellows, the connecting element according to the invention can be manufactured with extremely low reflection.

The inner conductor according to the invention, which is resilient in the axial and radial directions, is in fact particularly advantageous in measuring devices with coaxial jacks accessible from the outside, but can also be used successfully with all coaxial systems such as jacks, plugs, probe tips or similar, of which the inner conductors are exposed during operation to axial and radial forces, and which are connected at the other end to a sensitive substrate circuit.

Figure 2:
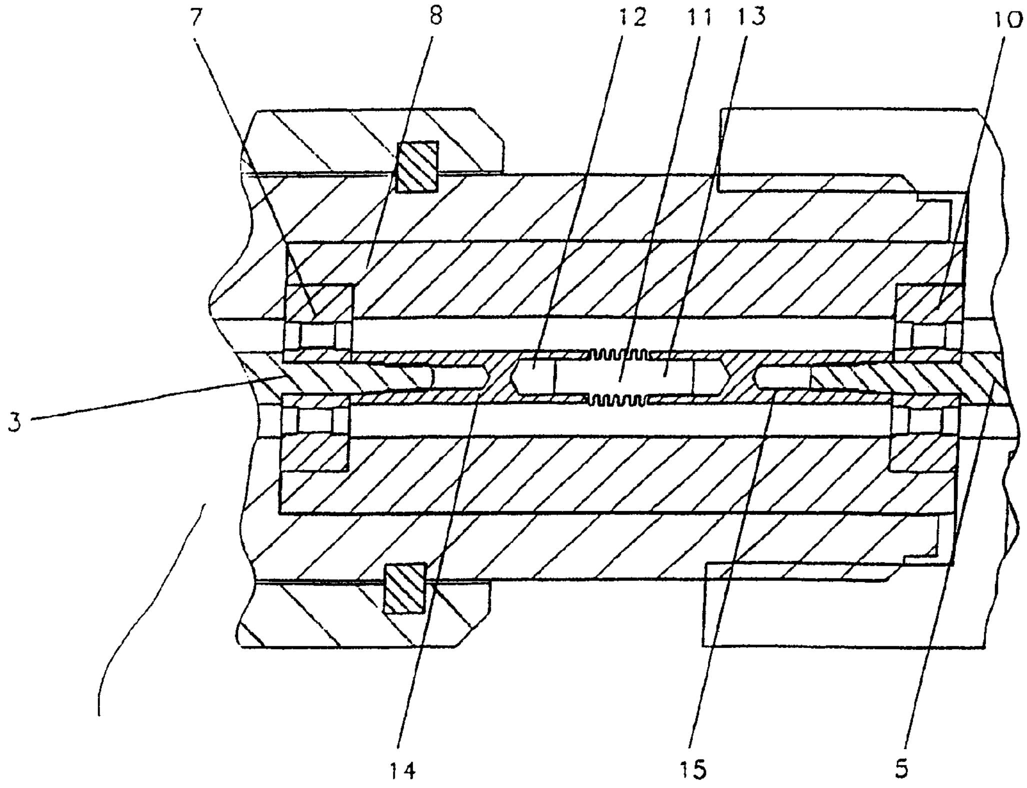

The invention is explained in greater detail below on the basis of an exemplary implementation with reference to schematic drawings. The drawings are as follows:

FIG. 1 shows in a partial perspective view the connection between a coaxial jack of a measuring device with a circuit carrier (substrate) installed in the interior of the measuring device; and FIG. 2 shows details of the coaxial connecting element used in this context in an enlarged view.

A coaxial jack 2, which is used as a measurement port and of which the inner conductor 3 is connected in the interior of the housing to the circuit of the measuring device formed on a planar circuit carrier 4, is mounted in the front panel 1 of a high-frequency measuring device, which is illustrated in FIG. 1 only in a fragmentary manner. The end 5 of the inner conductor inside the device is connected to the printed conductors of the circuit carrier 4, for example, by soldering. The inner conductor 3 of the jack 2 is held in the outer-conductor sleeves 6, 8 via a support disk 7 made of an isolating material.

Another outer-conductor sleeve 8, which accommodates an inner conductor 9, which connects the inner conductor 3 of the jack to the connecting end 5 on the circuit carrier 4, is inserted in the outer-conductor sleeve 6 of the jack 2.

The details of this coaxial connecting element are shown in an enlarged scale in FIG. 2. The inner conductor 9 is held in a concentric manner between the two supports 7 and 10 integrated in the outer-conductor sleeve and screwed with the inner conductors 3, 5 into the corresponding supports 7, 10. It is divided in the middle, and a resilient bellows 11 is inserted between its two halves 14 and 15. The inner-conductor halves 14 and 15 each provide end-face boreholes 12, into which pin-like projections 13 projecting axially from the bellows 11 are inserted. The bellows 11 is held between the inner conductor halves 14 and 15 in this manner.

The bellows 11, which is hollow inside, preferably consists of a thin foil-like nickel material, which is gold plated on the outside. In order to manufacture this resilient, thin-walled bellows, a blank of aluminium is first manufactured with the required contour, to the outside of which a thin nickel coating is then applied in a galvanic manner. This is finally gold plated.

The inner aluminium blank is then etched away to provide an extremely thin-walled bellows with a corrugated outer coating made of gold-plated nickel. The axially-projecting pin-like holding portions 13 of the bellows 11 are also manufactured in the same manner as hollow pins.

The contour of the bellows 11 is preferably selected in such a manner that the specified standard characteristic impedance of, for example, 50 ohms is provided even at the position of the bellows within the coaxial outer-conductor sleeve 8. This can be calculated and implemented using a 3-D simulator for high-frequency electromagnetic problems.

The resilient bellows can be deformed in a resilient manner in the axial direction as well as to a limited extent in the radial direction, and in this manner, forces, which act on the inner conductor 3 during the screwing and unscrewing of the measurement cable to and from the jack 2 by the user, can be absorbed. The bellows prevents such forces from being transferred from the inner conductor 3 of the jack to the inner-conductor end 5 at the connecting position with the substrate 4.

The invention is not restricted to the exemplary implementation presented. The elements described can be combined with one another as required.

The invention claimed is:

1. A connector for connecting a coaxial jack to a circuit carrier, comprising:

an outer conductive sleeve;

a conductive bellows having axial pins extending outwardly therefrom;

a first inner conductor positioned within the outer conductive sleeve having a first end and a second end, wherein the first end is supported by an insulator and is connectable to an inner conductor of the coaxial jack; and a second inner conductor positioned within the outer conductive sleeve having a first end and a second end, wherein the first end is supported by an insulator and is connectable to the circuit carrier;

wherein the second ends of the first and second inner conductors are separated by a gap within the outer conductive sleeve and have opposing axial bores into which the axial pins of the conductive bellows are fitted.

2. The connector of claim 1, wherein the conductive bellows has a contour selected to maintain a characteristic impedance of the connector at the bellows.

3. The connector of claim 1, wherein the conductive bellows is made of a thin-walled, gold-plated nickel material.

4. The connector of claim 1, wherein the insulators on the first and second inner conductors maintain a radial spacing between the first ends of the first and second inner conductors and the outer conductive sleeve and are spaced from the second ends of the first and second inner conductors such that the second ends of the first and second inner conductors are unsupported in the outer conductive sleeve.

* * * * *